(12) United States Patent
Perzlmaier et al.

(10) Patent No.: US 10,418,535 B2
(45) Date of Patent: Sep. 17, 2019

(54) OPTOELECTRONIC COMPONENT AND A METHOD OF PRODUCING AN OPTOELECTRONIC COMPONENT

(71) Applicant: OSRAM Opto Semiconductors GmbH, Regensburg (DE)

(72) Inventors: Korbinian Perzlmaier, Regensburg (DE); Anna Kasprzak-Zablocka, Donaustauf (DE); Christine Rafael, Donaustauf (DE); Christian Leirer, Friedberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 4 days.

(21) Appl. No.: 15/741,876

(22) PCT Filed: Jul. 28, 2016

(86) PCT No.: PCT/EP2016/068043
§ 371 (c)(1),
(2) Date: Jan. 4, 2018

(87) PCT Pub. No.: WO2017/017209
PCT Pub. Date: Feb. 2, 2017

(65) Prior Publication Data
US 2018/0198045 A1 Jul. 12, 2018

(30) Foreign Application Priority Data
Jul. 30, 2015 (DE) .................. 10 2015 112 538

(51) Int. Cl.
*H01L 33/50* (2010.01)
*H01L 33/46* (2010.01)
(Continued)

(52) U.S. Cl.
CPC .............. *H01L 33/60* (2013.01); *H01L 33/22* (2013.01); *H01L 33/38* (2013.01); *H01L 33/46* (2013.01);
(Continued)

(58) Field of Classification Search
CPC ....................................................... H01L 33/36
See application file for complete search history.

(56) References Cited

U.S. PATENT DOCUMENTS

2012/0132946 A1   5/2012   Park
2013/0105845 A1   5/2013   Kim et al.
(Continued)

FOREIGN PATENT DOCUMENTS

DE    10 2007 019 775 A1    10/2008
DE    10 2009 047 888 A1    3/2011
(Continued)

*Primary Examiner* — Moazzam Hossain
*Assistant Examiner* — Omar F Mojaddedi
(74) *Attorney, Agent, or Firm* — DLA Piper LLP (US)

(57) ABSTRACT

An optoelectronic component includes a boundary layer is arranged between a semiconductor body and a metallic layer in a lateral direction, adjoins the semiconductor body at least in places, covers an active layer laterally, and has a lower refractive index compared to the semiconductor body, a metallic layer is configured to prevent the electromagnetic radiation generated during operation of the component and passes through the boundary layer from impinging on a mold body, the boundary layer is formed from a radiation-transmitting dielectric material having a refractive index of 1 to 2, and a layer thickness of the boundary layer is at least 400 nm and selected such that an amplitude of an evanescent wave, which is obtained in the event of total internal reflection at an interface between the boundary layer and the semiconductor body, is reduced to less than 37% of its original value within the boundary layer.

20 Claims, 4 Drawing Sheets

(51) Int. Cl.
*H01L 33/36* (2010.01)
*H01L 33/60* (2010.01)
*H01L 33/38* (2010.01)
*H01L 33/22* (2010.01)
*H01L 33/54* (2010.01)

(52) U.S. Cl.
CPC ........ *H01L 33/54* (2013.01); *H01L 2933/005* (2013.01); *H01L 2933/0025* (2013.01); *H01L 2933/0058* (2013.01)

(56) References Cited

U.S. PATENT DOCUMENTS

2014/0138722 A1* 5/2014 Yamada .................. H01L 33/36
257/98
2014/0203314 A1 7/2014 Kojima et al.
2015/0034985 A1* 2/2015 Tomizawa .............. H01L 33/50
257/98

FOREIGN PATENT DOCUMENTS

| DE | 10 2010 024 079 A1 | 12/2011 |
| DE | 10 2010 025 320 A1 | 12/2011 |
| DE | 10 2012 217 776 A1 | 6/2012 |
| DE | 10 2013 103 079 A1 | 10/2014 |
| DE | 10 2015 111 558 A1 | 1/2017 |
| TW | 200950161 A | 12/2009 |
| TW | 201001753 A | 1/2010 |
| TW | 201236194 A | 9/2012 |

* cited by examiner

OPTOELECTRONIC COMPONENT AND A METHOD OF PRODUCING AN OPTOELECTRONIC COMPONENT

TECHNICAL FIELD

This disclosure relates to an optoelectronic component and a method of producing one or a plurality of optoelectronic components.

BACKGROUND

In a light-emitting component with a carrier composed of a potting material, short-wave electromagnetic radiation can get into the carrier and damage the carrier because of the light-sensitive potting material. Furthermore, electromagnetic radiation can escape at the side leading to losses of light and possibly to inhomogeneous color distribution of the emitted light.

It could therefore be helpful to provide an optoelectronic component having high efficiency and an inexpensive and simplified method of producing one or a plurality of these components.

SUMMARY

We provide an optoelectronic component including a carrier having an electrically insulating mold body, a semiconductor body having an active layer configured to generate electromagnetic radiation during operation of the component and a multilayer structure, wherein the mold body surrounds the semiconductor body laterally at least in places, the multilayer structure is arranged between the semiconductor body and the mold body in a lateral direction at least in places, and the multilayer structure comprises at least one metallic layer and a non-metallic boundary layer, wherein the boundary layer is arranged between the semiconductor body and the metallic layer in the lateral direction, adjoins the semiconductor body at least in places, covers the active layer laterally, and has a lower refractive index compared to the semiconductor body, the metallic layer is configured to prevent the electromagnetic radiation generated during operation of the component and passes through the boundary layer from impinging on the mold body, the boundary layer is formed from a radiation-transmitting dielectric material having a refractive index of 1 to 2, and a layer thickness of the boundary layer is at least 400 nm and selected such that an amplitude of an evanescent wave, which is obtained in the event of total internal reflection at an interface between the boundary layer and the semiconductor body, is reduced to less than 37% of its original value within the boundary layer.

We also provide a method of producing a plurality of components including A) preparing a composite having a growth substrate and a semiconductor composite arranged on the growth substrate; B) forming a plurality of separating trenches to sever the semiconductor composite into a plurality of semiconductor bodies; C) forming a multilayer composite at least in regions of the separating trenches; D) forming an electrically insulating mold body composite on the semiconductor bodies and in the regions of the separating trenches; E) removing the growth substrate; and F) singulating the composite along the separating trenches into a plurality of components so that the components each include a carrier with an electrically insulating mold body as part of the mold body composite, a semiconductor body with an active layer configured to generate electromagnetic radiation during operation of the associated component and a multilayer structure as part of the multilayer composite, wherein the mold body laterally surrounds the semiconductor body at least in places, the multilayer structure is arranged between the semiconductor body and the mold body in the lateral direction at least in places, the multilayer structure includes a metallic layer and a non-metallic boundary layer, wherein the boundary layer is arranged between the semiconductor body and the metallic layer in the lateral direction, adjoins the semiconductor body at least in places, and covers the active layer laterally and has a lower refractive index compared to the semiconductor body, and the metallic layer is configured to prevent the electromagnetic radiation generated during operation of the component and passes through the boundary layer from impinging on the mold body.

We further provide an optoelectronic component including a carrier having an electrically insulating mold body, a semiconductor body having an active layer configured to generate electromagnetic radiation during operation of the component and a multilayer structure, wherein the mold body surrounds the semiconductor body laterally at least in places, the multilayer structure is arranged between the semiconductor body and the mold body in a lateral direction at least in places, and the multilayer structure includes at least one metallic layer and a non-metallic boundary layer, wherein the boundary layer is arranged between the semiconductor body and the metallic layer in the lateral direction, adjoins the semiconductor body at least in places, and covers the active layer laterally and has a lower refractive index compared to the semiconductor body, the metallic layer is configured to prevent the electromagnetic radiation generated during operation of the component and passes through the boundary layer from impinging on the mold body, and the semiconductor body is roughened such that the multilayer structure projects beyond the semiconductor body in the vertical direction.

LIST OF REFERENCE NUMBERS

Figure 1:
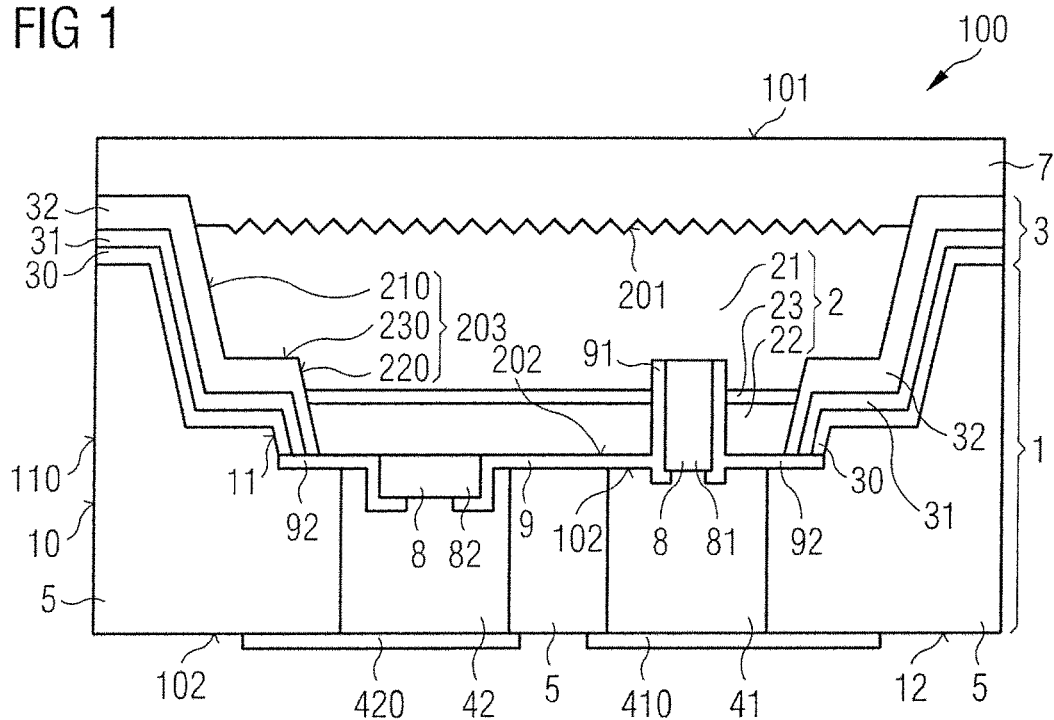
FIGS. 1 to 4 show schematic diagrams of various examples of a component in sectional views.

100 Component
101 Radiation passage surface/radiation exit surface
102 Rear side of the component
110 Side face of the component
1 Carrier
10 Side face of the carrier
11 Front side of the carrier
12 Rear side of the carrier
2 Semiconductor body
20 Semiconductor composite
200 Composite/wafer composite
201 First main surface of the semiconductor body
202 Second main surface of the semiconductor body
21 First semiconductor layer
22 Second semiconductor layer
23 Active layer
203 Side face of the semiconductor body
210 First sub-area of the side face
220 Second sub-area of the side face 230 Plane of the side face
3 Multilayer structure
300 Multilayer composite
30 Metallic layer
31 Dielectric layer stack
32 Boundary layer/low-refractive-index layer
33 Sacrificial layer/intermediate space
41 First through-contact
42 Second through-contact
410 First contact layer
420 Second contact layer
5 Mold body
50 Mold body composite
60 Separating trench/mesa trench
7 Converter layer
70 Substrate/growth substrate
8 Wiring structure
80 Mirror layer/combo mirror
81 Through-via
82 Connection layer
9 Insulation structure
91 Passivation layer
92 Insulation layer
93 Intermediate insulation layer

DETAILED DESCRIPTION

Our optoelectronic component may comprise a carrier and a semiconductor body arranged on the carrier. The carrier has a front side facing towards the semiconductor body and a rear side facing away from the semiconductor body. In particular, the carrier is produced directly on the semiconductor body. This means that the carrier is not produced for instance in a separate production step from the semiconductor body and then attached to the semiconductor body, but is deposited directly on the semiconductor body and therefore formed directly on the semiconductor body. The carrier in this case does not necessarily have to adjoin the semiconductor body directly. Between the carrier and the semiconductor body, further layers can be arranged for instance to electrically contact the semiconductor body.

The carrier comprises in particular an electrically insulating mold body preferably in the form of a mold body. For example, the mold body in the form of a mold body is formed by a molding method, in particular under the action of pressure. The semiconductor body is encapsulated for instance by a material of the mold body at least in places. Preferably, the mold body is formed from a plastics material, for instance a moldable polymer, for example, a casting resin such as epoxy resin or silicone. The plastics material can be filled with silicon oxide, for example, with SiO2 to adjust the coefficient of thermal expansion (CTE).

The semiconductor body has a first main surface facing away from the carrier and a second main surface facing towards the carrier. The main surfaces delimit the semiconductor body in particular in a vertical direction. A vertical direction is understood to mean a direction oriented in particular perpendicularly to a main extension area of the semiconductor body. In particular, the vertical direction is the growth direction of the semiconductor layers of the semiconductor body. A lateral direction means a direction running for instance parallel to the main extension area of the semiconductor body. In particular, the vertical direction and the lateral direction are oriented transversely, for instance perpendicularly, to one another.

The semiconductor body comprises in particular a first semiconductor layer facing away from the front side of the carrier, a second semiconductor layer facing towards the front side of the carrier and an active layer arranged between the first and the second semiconductor layer in the vertical direction. During operation of the component, the active layer is preferably configured to generate electromagnetic radiation, for instance in the visible, ultraviolet or infrared range of the spectrum. For example, the active layer is a p-n junction zone formed as one layer or as a layer sequence composed of multiple layers. The semiconductor body is preferably deposited in layers on a growth substrate by an epitaxial method. However, the growth substrate can be removed from the semiconductor body in a subsequent method stage so that the component is in particular free from a growth substrate.

The semiconductor body may be laterally surrounded by the mold body, at least in places. In the vertical direction, the mold body projects beyond the second main surface of the semiconductor body, for instance. It is also possible that the mold body projects beyond the second and beyond the first main surface, i.e., beyond the entire semiconductor body in the vertical direction. The semiconductor body has a side face that can be partly or completely covered by the mold body in the lateral direction. The mold body can completely surround the semiconductor body laterally.

The component may comprise a multilayer structure. The multilayer structure is in particular arranged between the semiconductor body and the mold body in the lateral direction, at least in places. The multilayer structure is preferably configured to absorb electromagnetic radiation emitted during operation of the component, which can escape from the semiconductor body by way of the side face of the semiconductor body, or preferably to reflect it back into the semiconductor body.

The multilayer structure can comprise a non-metallic boundary layer and a metallic layer. In particular, the boundary layer is arranged between the semiconductor body and the metallic layer in the lateral direction. The boundary layer can adjoin the semiconductor body. It is possible in this case that a thin connecting layer, for instance an adhesive layer, is arranged between the boundary layer and the semiconductor body, the connecting layer having a layer thickness of no more than 50 nm, preferably no more than 30 nm or no more than 10 nm. The boundary layer is in particular configured to promote total internal reflection on the side face of the semiconductor body. Expediently, the boundary layer has a lower refractive index compared to the semiconductor body. In particular, the boundary layer comprises a radiation-transmitting, low-refractive-index material. For example, the refractive index of the boundary layer is 1 to 2, for instance 1 to 1.6, for example, 1 to 1.4. Preferably, the boundary layer is formed to be transparent and in particular to be transmissive for the radiation generated during operation of the component.

The metallic layer is arranged for instance between the boundary layer and the mold body in the lateral direction. In particular, the metallic layer is configured to prevent electromagnetic radiation generated during operation of the component from impinging on the mold body. The metallic layer here can be formed such that it absorbs or preferably reflects the electromagnetic radiation emitted during operation of the component. The metallic layer in this case can adjoin the mold body. The multilayer structure can be formed such that it is delimited laterally by the boundary layer and the metallic layer, at least in places. In other words, the metallic layer and the boundary layer can be formed as the outermost layers of the multilayer structure in places.

The optoelectronic component may comprise a carrier having an electrically insulating mold body, a semiconductor body having an active layer configured to generate electromagnetic radiation during operation of the component and a multilayer structure. In lateral directions, the mold body surrounds the semiconductor body at least in places. The multilayer structure is arranged between the semiconductor body and the mold body in the lateral direction, at least in places. The multilayer structure comprises a metallic layer and a non-metallic boundary layer, the boundary layer being arranged between the semiconductor body and the metallic layer in the lateral direction, adjoining the semiconductor body at least in places, covering the active layer laterally and having a lower refractive index compared to the semiconductor body. The metallic layer is configured to prevent electromagnetic radiation generated during operation of the component and passes through the boundary layer from impinging on the mold body.

With the aid of the multilayer structure, the reflectance at the side face of the semiconductor body can be increased in particular by total internal reflection at the boundary layer and reflection at the metallic layer. At the same time, irradiation of the carrier, in particular of the mold body, can be prevented with the aid of the multilayer structure. Light-sensitive material of the mold body can be protected from short-wave radiation components so that a possible degradation of the material, for instance a potting material, of the mold body by irradiation with blue light or with UV light is avoided.

A layer thickness of the boundary layer may be selected such that the amplitude of an evanescent wave obtained at an interface between the boundary layer and the semiconductor body in the event of total internal reflection, is reduced within the boundary layer to less than 37% of its original value, i.e., less than 1/e where e is the Euler's number. For example, a product of the refractive index and the layer thickness of the boundary layer is greater than a peak wavelength of the electromagnetic radiation generated by the active layer during operation of the component. In particular, the product is greater than or equal to 400 nm, greater than or equal to 800 nm or greater than or equal to 1 μm.

The evanescent wave can occur in or behind an interface at which waves are reflected such as, for example, in the event of total internal reflection. If the evanescent wave cannot propagate in a medium, its amplitude behind the interface does not fall to zero, but decays exponentially. If the boundary layer is located between the semiconductor body and a further layer composed of a medium having a higher optical density compared to the boundary layer, parts of the radiation impinging on the boundary layer can (even where total internal reflection is present) be transmitted into the further layer based on an evanescent field, whereby an intensity of the radiation totally internally reflected at the interface is attenuated. This effect is known as frustrated total internal reflection. To avoid frustrated total internal reflection and therefore prevent any possible attenuated reflected radiation, the layer thickness of the boundary layer can be selected such that the evanescent wave is sufficiently suppressed within the boundary layer. In particular, the layer thickness of the boundary layer is greater than the penetration depth of the evanescent wave, the amplitude of the evanescent wave being reduced to about 37% of its original value at the penetration depth. In particular, the layer thickness of the boundary layer is selected such that an amplitude of an evanescent wave within the boundary layer is reduced to less than 30%, for instance to less than 20%, in particular to less than 5% of its original value.

The boundary layer may be formed from a radiation-transmitting dielectric material having a refractive index of 1 to 2. In particular, the layer thickness of the boundary layer is at least 400 nm, for instance 400 nm to 1 μm or 400 nm to 3 μm, for instance 400 nm to 5 μm. With such a layer thickness, it can be ensured that the evanescent wave can be sufficiently suppressed in the boundary layer with respect to wavelengths in the infrared, visible and ultraviolet range of the spectrum of the electromagnetic radiation emitted during operation of the component so that frustrated total internal reflection does not occur, or barely occurs, and the intensity of the electromagnetic radiation reflected at the interface is not, or is barely, attenuated. Because of the boundary layer having a low refractive index, total internal reflection is favored at the side face of the semiconductor body and can be achieved without any significant losses in the radiation intensity of the totally internally reflected electromagnetic radiation.

An intermediate space may be arranged between the semiconductor body and the boundary layer in the lateral direction. The boundary layer here can comprise a first subregion and a second subregion, the first subregion adjoining the semiconductor body and the second subregion adjoining the intermediate space so that the intermediate space is arranged between the semiconductor body and the second subregion of the boundary layer in the lateral direction. Thus, both the boundary layer and the intermediate space can adjoin the semiconductor body in places. In particular, the boundary layer, for instance the first subregion of the boundary layer, completely covers the active layer of the semiconductor body laterally. The intermediate space and the active layer can be free from overlaps along the vertical and/or along the lateral direction. The intermediate space can be a space which is empty of gas or a space filled with a gaseous medium, for instance air. The intermediate space can have an opening to the external environment of the component on a side face of the component or can be sealed from the external environment, in particular in an air-tight manner. Vacuum and air have a particularly low refractive index and so total internal reflection is particularly promoted at an interface between the semiconductor body and air or vacuum.

The metallic layer may contain or consist of a metal. It is also possible that the metallic layer is formed from a plurality of metals, for instance in the form of a metal alloy or a metal layer stack. In particular, the metallic layer has a layer thickness of at least 100 nm, for instance at least 200 nm or at least 400 nm. The metallic layer can be thicker than 1 μm, 3 μm or 5 μm. The layer thickness and the materials of the metallic layer can be selected such that the metallic layer has an absorbing or reflecting effect for the electromagnetic radiation generated by the active layer during operation of the component.

The multilayer structure may comprise a radiation-reflecting layer stack composed of a plurality of dielectric layers. The dielectric layers here can have different layer thicknesses and/or different refractive indices. The layer stack here is preferably arranged between the metallic layer and the boundary layer in the lateral direction. In particular, the layer stack is formed as a dielectric mirror, for instance in the form of a DBR mirror (distributed Bragg reflector). The layer stack can be formed as a DBR mirror in reduced form. For example, the layer stack comprises two, three or more dielectric layers. The dielectric layer stack is preferably configured to reflect any electromagnetic radiation passing through the boundary layer back towards the semiconductor body. However, it is also possible that the multilayer structure is free from a radiation-reflecting layer stack of this type. In this case, the reflection of any electromagnetic radiation passing through the boundary layer can be achieved on the metallic layer.

The boundary layer may cover the second semiconductor layer and the active layer completely in the lateral direction and covers the first semiconductor layer at least in places. This is intended to ensure an electrical insulation of different semiconductor layers of the semiconductor body on the side face thereof. It is possible that the side face of the semiconductor body is completely covered in the lateral direction by the multilayer structure, in particular by the boundary layer. It is also possible that all side faces of the semiconductor body are at least partly or completely covered in the lateral direction by the multilayer structure. The semiconductor body can therefore be surrounded to the full extent and completely by the multilayer structure in lateral directions. Alternatively, it is also possible that at least 90% of the side face is covered by the multilayer structure, in which case part of the side face can remain uncovered by the multilayer structure.

The side face may comprise a step. The step comprises a plane extending in lateral directions. The plane in this case can run parallel to the first main surface and/or the second main surface of the semiconductor body. It is also possible that the plane runs obliquely to the first main surface and/or to the second main surface. In particular, the plane of the step is formed exclusively by a surface of the first semiconductor layer of the semiconductor body. The first semiconductor layer here is arranged between the first main surface and the active layer in the vertical direction. The step can have vertical edges each adjoining the lateral plane of the step, for instance. The edges here can be formed perpendicularly or obliquely to the first and/or second main surface. In particular, the edges of the step each form an angle of 20° to 80°, for instance 20° to 70° or 30° to 60°, with a line perpendicular to the plane. With a step on the side face, the multilayer structure can be deposited on the semiconductor body more easily.

The carrier may comprise at least one through-contact to electrically contact the semiconductor body. The through-contact extends in particular through the mold body in the vertical direction. The through-contact here can be surrounded to the full extent by the mold body in lateral directions. The carrier can comprise a plurality of these through-contacts. For example, the carrier comprises a first through-contact and a second through-contact electrically isolated from the first through-contact, the first through-contact and the second through-contact being assigned to different electrical polarities of the component. The through-contacts are preferably formed such that they are electrically contactable for instance on a rear side of the mold body or of the carrier. On its rear side, the component can comprise contact layers each of which electrically connects to one of the through-contacts. By way of the contact layers, the through-contacts can electrically connect for instance to an external voltage source. The front side and/or the rear side of the carrier can each be formed at least in places by surfaces of the mold body and in places by surfaces of the through-contacts.

The component, by the configuration of the carrier, is preferably configured such that it can be electrically contacted externally and surface-mounted via its rear side. In a top view, the contact layers can cover a large part of the rear side of the component, for instance at least 50%, preferably at least 70% or at least 80% of the rear side of the component. The rear side of the component can therefore be formed in places by surfaces of the contact layers, wherein the rear side can be formed with the surfaces of the contact layers as a mounting surface, in particular as a solderable mounting surface.

The component may comprise a mirror layer on a main surface of the semiconductor body facing towards the carrier. In particular, the mirror layer projects sidewards in the lateral direction beyond the main surface and/or beyond the active layer. In a top view, the mirror layer can cover a large part, for instance at least 70%, in particular at least 80% and preferably at least 90%, of the second main surface and/or of the active layer. The mirror layer here can be formed as a constituent of a wiring structure of the component. The wiring structure is arranged in particular between the semiconductor body and the carrier in the vertical direction. The wiring structure can comprise sublayers directly electrically connected to different semiconductor layers of the semiconductor body, for instance. For example, the wiring structure comprises a connection layer by way of which a semiconductor layer of the semiconductor body electrically connects to a through-contact. The wiring structure can also comprise a through-via, by way of which a further semiconductor layer of the semiconductor body, for instance, electrically connects to a further through-contact of the carrier. It is also possible that the mirror layer is formed only in the region of the through-via and/or the connection layer so that the mirror layer comprises non-coherent subregions. The mirror layer can comprise a subregion formed for instance in the shape of a frame and for instance surrounds the through-via and/or the connection layer. In this case, the mirror layer can cover less than 70% or less than 50% of the second main surface and/or of the active layer.

The through-via of the wiring structure can extend in the vertical direction from the second main surface of the semiconductor body throughout the second semiconductor layer and the active layer to the first semiconductor layer. The through-via here can be in direct electrical contact with the first semiconductor layer. It is also possible for the wiring structure to comprise a plurality of these through-vias for current spreading in the first semiconductor layer. The mirror layer arranged between the semiconductor body and the carrier can be electrically conductive. For example, the mirror layer electrically connects to the connection layer or the through-via. In a top view, the mirror layer together with the connection layer or connection layers can completely cover the second main surface and/or the active layer. The radiation emitted during operation of the component, which passes through the second main surface of the semiconductor body, can be reflected back at the mirror layer or at the connection layer towards the first main surface of the semiconductor body or towards the radiation exit surface of the component, whereby the efficiency of the component is increased. At the same time, for instance short-wave electromagnetic radiation can be prevented from reaching the mold body of the carrier by way of the second main surface of the semiconductor body and damaging the mold body.

We also provide a method of producing a plurality of components, a composite, for instance a wafer composite, having a growth substrate and a semiconductor composite arranged on the growth substrate. The semiconductor composite can be deposited on the growth substrate by a coating method, preferably by an epitaxial method. To sever the semiconductor composite into a plurality of semiconductor bodies, a plurality of separating trenches can be formed in the semiconductor composite. The separating trenches can be formed through a semiconductor layer, for instance through the second semiconductor layer, and through the active layer in the vertical direction. The separating trenches here can each have a bottom surface formed for instance by a surface of a further semiconductor layer, for instance the first semiconductor layer of the semiconductor body. In this case, the semiconductor bodies can mechanically connect to one another for instance by the first semiconductor layer of the semiconductor composite. It is possible that the separating trenches are created in the vertical direction through the semiconductor composite to the growth substrate.

A multilayer composite is formed at least in regions of the separating trenches. The multilayer composite here can partly or completely cover internal walls of the separating trenches or side faces of the semiconductor bodies. An electrically insulating mold body composite is formed for instance on the semiconductor bodies and in the regions of the separating trenches, for instance by a molding method. In a subsequent method stage, the growth substrate is removed from the semiconductor composite or from the semiconductor bodies. The composite is then singulated into a plurality of components along the separating trenches so that the components each comprise a carrier with a mold body as part of the mold body composite, a semiconductor body with an active layer configured to generate electromagnetic radiation during operation of the component and a multilayer structure as part of the multilayer composite.

The method described here is particularly suitable to produce one or a plurality of the components described here. The features described in association with the component can therefore also be referred to for the method and vice versa.

Formation of the separating trenches in the semiconductor composite may take place in at least two stages so that the separating trenches each have an internal wall with a step. The step preferably contains a plane extending in lateral directions, wherein the plane is formed for instance by a first stage before a second stage. In the presence of the step, the multilayer composite can be formed more easily in regions of the separating trenches. Alternatively, it is also possible for the separating trenches to be formed only in a single method stage such that the separating trenches have internal walls that are perpendicular or oblique to the growth substrate.

A sacrificial layer may be deposited on side faces of the semiconductor body at least in the region of one or a plurality of separating trenches. The sacrificial layer here can adjoin the semiconductor body. In particular, the sacrificial layer can be formed such that it only covers one semiconductor layer of the semiconductor body, for instance the first semiconductor layer, in places in a lateral direction. The sacrificial layer is in particular free from a lateral overlap with the active layer. In particular, the sacrificial layer is formed prior to the boundary layer. The boundary layer can be deposited on the sacrificial layer in a subsequent method stage, for instance covering the second semiconductor layer and the active layer completely in a lateral direction and covering the first semiconductor layer and/or the sacrificial layer at least in places in a lateral direction.

After removal of the growth substrate, the sacrificial layer can be removed partly or completely to form the intermediate space, for example, by under-etching. The intermediate space here can be in the form of an air gap. It is possible that a layer, for instance a converter layer or a sealing layer, is deposited on the semiconductor body such that the intermediate space is sealed by the layer in particular in an airtight manner. Preferably, the converter layer is present in the form of a film before being deposited on the semiconductor body. The converter film can for instance be laminated on to the semiconductor body. The intermediate space can be sealed by the converter film in particular in an airtight manner without being filled by a converter material or by a liquid medium. If the converter layer is deposited on the semiconductor body in vacuum, the intermediate space can be a space which is empty of gas.

The converter layer is deposited on the semiconductor body preferably after formation of the intermediate space. Alternatively, it is possible to form the intermediate space only after the converter layer has been deposited. This can take place, for example, after the composite has been singulated into a plurality of components, wherein the sacrificial layer becomes accessible from the side face of the component after the singulation, for instance. In this case, the intermediate space can comprise an opening on the side face of the component. However, this opening can be covered by a sealing layer so that for instance moisture or harmful gases can be kept away from the intermediate space.

Further advantages and preferred developments of the component and the method can be taken from the examples explained below in association with FIGS. 1 to 5E.

Identical or similar elements or elements having the same effect are provided with the same reference numbers in the figures. The figures are all schematic diagrams and therefore not necessarily to scale. Rather, for the sake of clarity, the size of relatively small elements, and in particular layer thicknesses, may be exaggerated.

FIG. 1 shows an example of a component 100. The component 100 comprises a carrier 1 and a semiconductor body 2. The semiconductor body 2 has a first main surface 201 facing away from the carrier 1 and a second main surface 202 facing towards the carrier 1. The semiconductor body 2 comprises a first semiconductor layer 21 which is for instance p-type, a second semiconductor layer 22 which is for instance n-type and an active layer 23 arranged between the semiconductor layers. Alternatively, the first semiconductor layer 21 can be n-type and the second semiconductor layer 22 p-type.

The semiconductor body 2 can be formed from an III/V compound semiconductor material. An III/V compound semiconductor material comprises an element from the third main group such as for instance B, Al, Ga, In, and an element from the fifth main group such as for instance N, P, As. In particular, the term "III/V compound semiconductor material" comprises the group of the binary, ternary or quaternary compounds that contain at least one element from the third main group and at least one element from the fifth main group, e.g., nitride and phosphide compound semiconductors. A binary, ternary or quaternary compound of this type can also comprise, for example, one or more dopants and additional constituents. Deviating from this, the semiconductor body 2 can be formed from an II/VI compound semiconductor material.

The component 100 has a radiation exit surface 101 and a rear side 102 facing away from the radiation exit surface. The radiation exit surface 101 is formed according to FIG. 1 by a surface of a converter layer 7. The converter layer 7 can contain a converter material capable of converting electromagnetic radiation of a first peak wavelength to electromagnetic radiation of a second peak wavelength. In particular, the active layer 23 emits electromagnetic radiation with the first peak wavelength during operation of the component 100, the first peak wavelength being lower than the second peak wavelength of the radiation converted by the converter layer 7. The converter material can be embedded in a matrix material, for instance in silicone. Deviating from FIG. 1, the radiation exit surface 101 can be patterned or formed by a surface of the first semiconductor layer 21, for instance by the first main surface 201. It is also possible that a sealing passivation is arranged between the converter layer 7 and the semiconductor body 2. The component 100 can also be free from the converter layer 7 and/or free from the sealing passivation.

The carrier 1 comprises a mold body 5. The mold body 5 is in particular a mold body. In particular, the mold body 5 is a coherent mold body, in particular a mold body formed in one piece. The mold body 5 here can be formed in a single method stage, for instance by a molding method. It is possible in this case that a mold body composite 50 is initially formed on a semiconductor composite 20 or on a plurality of semiconductor bodies 2. After a singulation stage, a plurality of components 100 can be produced, each comprising a mold body 5 which is for instance coherent and formed in one piece, wherein the mold body 5 of the respective component 100 originates from the mold body composite 50 during singulation.

To electrically contact the semiconductor body 2, the carrier 1 comprises a first through-contact 41 and a second through-contact 42. The first through-contact 41 and the second through-contact 42 each extend through the mold body 5 in the vertical direction. The carrier 1 has in particular a front side 11 facing towards the semiconductor body 2 and a rear side 12 facing away from the semiconductor body 2. The front side 11 and the rear side 12 of the carrier 1 are each formed in places by surfaces of the mold body 5 and in places by surfaces of the through-contacts 41 and 42. In the vertical direction, the through-contacts 41 and 42 therefore extend for instance from the rear side 12 of the carrier 1 to the front side 11 of the carrier 1. The rear side 102 of the component is formed at least in places by the rear side 12 of the carrier 1.

For example, the through-contacts 41 and 42 are formed to be electrically contactable on the rear side 102 of the component 100 or on the rear side 12 of the carrier 1. This means that the through-contacts 41 and 42 can make indirect or direct electrical contact with an external electrical voltage source, for instance, on the rear side 102. In FIG. 1, the through-contacts 41 and 42 are each covered by a contact layer 410 or 420, which is in particular in the form of a solder layer or protective layer. On the rear side 102, the first through-contact 41 and the second through-contact 42 are each, for example, completely covered by a first contact layer 410 or by a second contact layer 420. The contact layer 410 or 420 can contain, for example, Au, Pd, Ag, Sn, Cu, Ni and/or Pt. In particular, the contact layer is a CuSn, NiSn, CuNiSn, TiAu, TiPtAu, NiAu, TiAuSn, TiPtAuSn, NiAuSn or NiPdAu layer. The contact layer can also be an SnAgCu layer (SAC solder layer), an AuSn layer, a CuAgNi layer or a pure Ag, Cu or Au layer.

To electrically contact the semiconductor body 2, the component 100 comprises a wiring structure 8. The wiring structure 8 can comprise one or a plurality of through-vias 81 and at least one connection layer 82. In particular, the first through-contact 41 electrically connects to the first semiconductor layer 21 by way of the through-via 81. The through-via 81 extends in particular through the second semiconductor layer 22 and the active layer 23 into the first semiconductor layer 21 in the vertical direction. The second through-contact 42 electrically connects to the second semiconductor layer 22 for instance by way of the connection layer 82.

The component 100 comprises an insulation structure 9. The insulation structure 9 is arranged between the semiconductor body 2 and the carrier 1, at least in places. The insulation structure 9 comprises a passivation layer 91 extending into the semiconductor body 2 in places in the vertical direction and electrically insulates the through-via 81 from the second semiconductor layer 22 and from the active layer 23 in lateral directions. In FIG. 1, the insulation structure 9 comprises an insulation layer 92 with a plurality of openings for the partial exposure of the connection layer 82 or the through-via 81, the connection layer 82 and the through-via 81 each electrically connected by one of the openings to one of the through-contacts 41 and 42. The insulation layer 92 adjoins the semiconductor body 2, for instance. The insulation layer 92 and the passivation layer 91 can adjoin one another or formed coherently and in particular in one piece.

The carrier 1 according to FIG. 1 has side faces 10 that can be formed exclusively by surfaces of the mold body 5. The component 100 has side faces 110 formed partly by side faces 10 of the carrier 1. The mold body 5 is formed such that it projects beyond the second semiconductor layer 22 and the active layer 23 in the vertical direction.

The component 100 comprises a multilayer structure 3. In lateral directions, the semiconductor body 2 is in particular surrounded to the full extent by the multilayer structure 3. The semiconductor body 2 has a side face 203 in particular completely covered in the lateral direction by the multilayer structure 3. Preferably, all the side faces 203 of the semiconductor body 2 are partly or completely covered by the multilayer structure 3. The multilayer structure 3 is configured on the one hand to favor or promote total internal reflection at side faces 203 of the semiconductor body 2 and on the other hand to prevent the electromagnetic radiation generated during operation of the component from passing into the mold body 5 by way of the side faces 203.

The multilayer structure 3 comprises a non-metallic boundary layer 32. The boundary layer 32 can adjoin the side faces 203 of the semiconductor body 2. It is also possible that a thin adhesive layer is arranged between the boundary layer 32 and the semiconductor body 2. The adhesive layer can have a layer thickness of for instance no more than 50 nm, for example, no more than 30 nm or no more than 10 nm or no more than 3 nm. To favor total internal reflection at the side face 203 of the semiconductor body 2, a material of the boundary layer 32 is selected such that the boundary layer 32 has a lower refractive index compared to the semiconductor body 2. Preferably, the refractive index of the boundary layer is 1 to 2, for instance 1 to 1.6 or 1 to 1.4. To form the boundary layer 32, the side face 203 of the semiconductor body is coated, e.g., with a transparent dielectric material, for instance with $SiO_2$. To suppress the evanescent wave, the boundary layer 32 can have a layer thickness of about 400 nm. It is possible here that the adhesive layer with a layer thickness of for instance 10 nm and with a higher refractive index compared to the boundary layer is arranged between the semiconductor body 2 and the boundary layer 32 without losing the effect in relation to the suppression of the evanescent wave. The thin adhesive layer can be, for example, an SiN layer, for instance an $Si_3N_4$ layer.

According to FIG. 1, the side face 203 of the semiconductor body comprises a step. The step comprises a plane 230 extending in lateral directions. The plane 230 is formed exclusively by a surface of the first semiconductor layer 21. The step is furthermore formed by a first sub-area 210 and a second sub-area 220 of the side face 203. The first sub-area 210 is likewise formed exclusively by a surface of the first semiconductor layer 21. The second sub-area 220 is formed in places by a surface of the first semiconductor layer 21 and in places by a surface of the second semiconductor layer 22. The plane 230 of the side face 203 connects the first sub-area 210 to the second sub-area 220 and thus, together with the sub-areas 210 and 220, forms the step of the side face 203. In FIG. 1, the plane 230 runs substantially parallel to the second main surface 202 of the semiconductor body 2. The sub-areas 210 and 220 each run obliquely to the second main surface 202. Because of the step, the multilayer structure can be deposited more easily on the side face 203.

The multilayer structure 3 comprises a metallic layer 30 facing towards the mold body 5. In particular, the metallic layer can adjoin the mold body 5. It is possible in this case that a thin adhesion promoter layer is arranged between the metallic layer 30 and the mold body 5. The metallic layer 30 can contain a metal or consist of one or more metals. The material of the metallic layer 30 can be selected such that the metallic layer overall is radiation-reflecting, preferably highly reflective. For example, the metallic layer 30 comprises a metal such as silver, aluminum or gold. Further reflective materials such as titanium, platinum, tantalum, nickel, copper or chromium are likewise suitable. It is also possible that the metallic layer 30 is formed to be radiation-absorbing. The metallic layer 30 is configured to prevent electromagnetic radiation generated during operation of the component from impinging on the mold body 5. The metallic layer here can have a layer thickness of at least 100 nm, for instance at least 300 nm or at least 500 nm. The metallic layer 30 can be deposited on the side face 203 of the semiconductor body 2 for instance using an adhesive layer or by an electroplating method using a seed layer. The metallic layer 30 here can for instance replicate the step of the side face 203.

The mold body 5 is deposited on the metallic layer 30 preferably by a molding method. A molding method is understood to mean in general a method by which a molding compound can be configured according to a predefined shape and, if necessary, cured. In particular, the term "molding method" includes molding, film-assisted molding, injection molding, transfer molding and compression molding. The mold body 5 here can have a side face facing towards the semiconductor body 2, which can for instance replicate a contour of the metallic layer 30 or of the side face 203 with the step. The side face of the mold body 5 facing towards the semiconductor body 2 forms in particular the front side 11 of the carrier 1 in places. This side face of the mold body 5 here can be completely covered by the multilayer structure 3 and in particular by the metallic layer 30.

According to FIG. 1, the multilayer structure 3 comprises a dielectric mirror 31. The dielectric mirror 31 can be formed as a dielectric layer stack composed of a plurality of dielectric layers with different refractive indices. In the lateral direction, the layer stack 31 which is configured as a dielectric mirror is arranged between the metallic layer 30 and the boundary layer 32. The dielectric mirror 31 can comprise a plurality of dielectric layers of different materials, for instance a layer sequence composed of titanium dioxide and silicon dioxide. The titanium oxide and silicon oxide layers can be arranged alternately. However, the dielectric mirror 31 can be optional, for example, if the metallic layer 30 is formed to be reflective or highly reflective.

Figure 2:
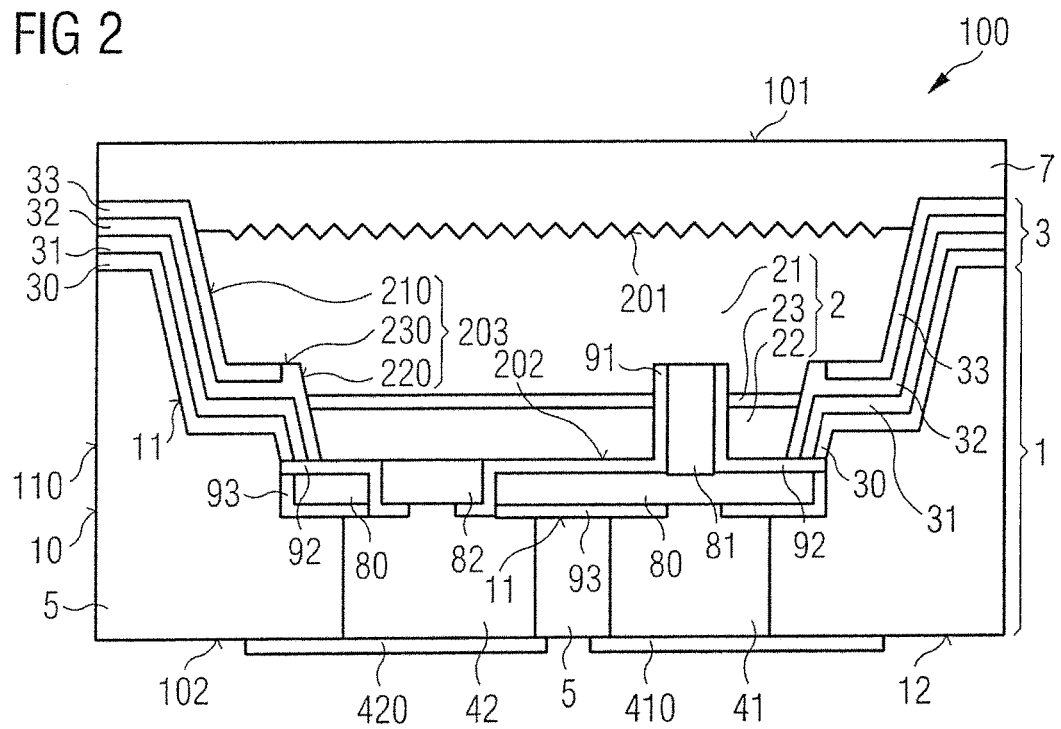

The example of a component 100 illustrated in FIG. 2 substantially corresponds to the example illustrated in FIG. 1. In contrast thereto, the component 100 comprises an intermediate space 33. The intermediate space 33 is arranged between the semiconductor body 2 and the boundary layer 32 in the lateral direction. In the vertical direction, the intermediate space 33 extends for instance from the first main surface 201 for instance to the plane 230. The intermediate space 33 adjoins in particular the first sub-area 210 and the plane 230 of the step of the side face 203 of the semiconductor body 2. In FIG. 2, the intermediate space 33 covers the first sub-area 210 and the plane 230, the second sub-area 220 of the side face 203 being free from the intermediate space 33 at least in places. The intermediate space 33 is formed in particular by under-etching a sacrificial layer. The intermediate space 33 can therefore contain remnants of the sacrificial layer in places. Preferably, the sacrificial layer is formed from a selectively etchable material, composed for instance of SiO2 or ZnO. Particularly preferably, the sacrificial layer is formed from a readily etchable or readily soluble material. For example, the sacrificial layer is a resist layer, for instance a photo-patternable resist layer.

The boundary layer 32 can adjoin both the semiconductor body 2 and the intermediate space 33. In particular, boundary layer 32 covers the second sub-area 220 completely. The boundary layer 32 is preferably in an electrically insulating form so that electrical insulation is ensured in particular in the region of the active layer 23, i.e., in the region of a p-n junction.

The intermediate space 33 illustrated in FIG. 2 is formed in particular as an air gap. The side face 110 of the component 100 can comprise an opening into the intermediate space 33. In the vertical direction, the intermediate space extends from the converter layer 7 along the first sub-area 210 to below the plane 230, the plane 230 partly covering the intermediate space 33 in a top view.

In a further contrast to FIG. 1, the wiring structure 8 comprises a mirror layer 80. The mirror layer 80 is arranged between the semiconductor body 2 and the carrier 1 in the vertical direction. In particular, the mirror layer 80 is formed from an electrically conductive and highly reflective metal. According to FIG. 2, the mirror layer 80 electrically connects to the through-via 81 and the first through-contact 41. The mirror layer 80 here is electrically insulated from the second through-contact 42 and the connection layer 82 by the insulation structure 9, in particular by the insulation layer 92 and an intermediate insulation layer 93. It is, however, also possible that the mirror layer 80 is in electrical contact with the second through-contact 42 and is electrically insulated from the first through-contact 41 and from the through-via 81.

In the lateral direction, the mirror layer 80 can project sidewards beyond the second main surface 202 and beyond the active layer 23 of the semiconductor body. It is also possible, however, that the active layer 23 completely covers the mirror layer 80. In a top view, the mirror layer 80 can cover at least 70%, at least 80%, preferably at least 90% of a total area of the second main surface 202 and/or of the active layer 23. Together with the connection layer 82, which can likewise be radiation-reflecting, the mirror layer 80 can completely cover the second main surface 202 and/or the active layer 23. It is also possible for the mirror layer to have a reflectance of less than 50% and to be formed as a reinforcing layer with a layer thickness of at least 5 µm. It is also possible that the mirror layer 80 is not formed coherently, comprises a plurality of spatially separated sub-regions and covers less than 70% or less than 50% of the total area of the second main surface 202 and/or of the active layer 23.

Figure 3:
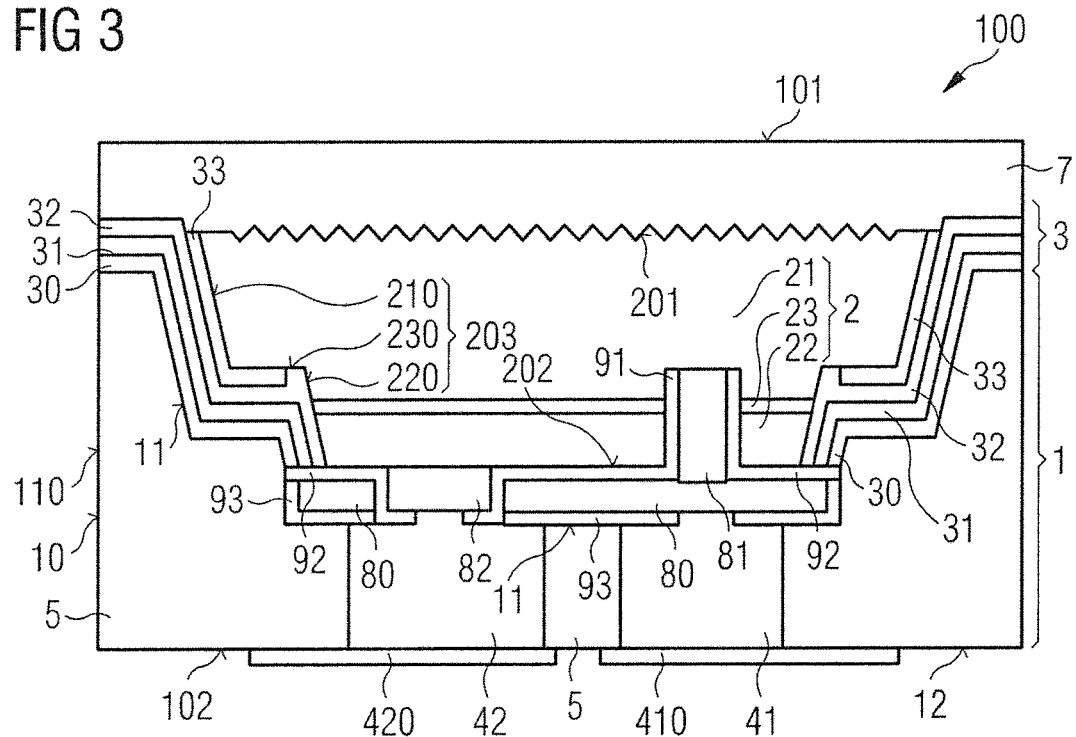

The example of a component 100 illustrated in FIG. 3 substantially corresponds to the example illustrated in FIG. 2. In contrast thereto, the intermediate space 33 is sealed by the converter layer 7 for instance in an airtight manner or sealed such that radiation-absorbing foreign particles cannot penetrate into the intermediate space. The side face 110 of the component 100 is therefore free from an opening into the intermediate space 33. By capping the intermediate space 33, for instance harmful gases or moisture or radiation-absorbing particles can be prevented from penetrating into the intermediate space 33 and possibly damaging the semiconductor body 2.

Figure 4:
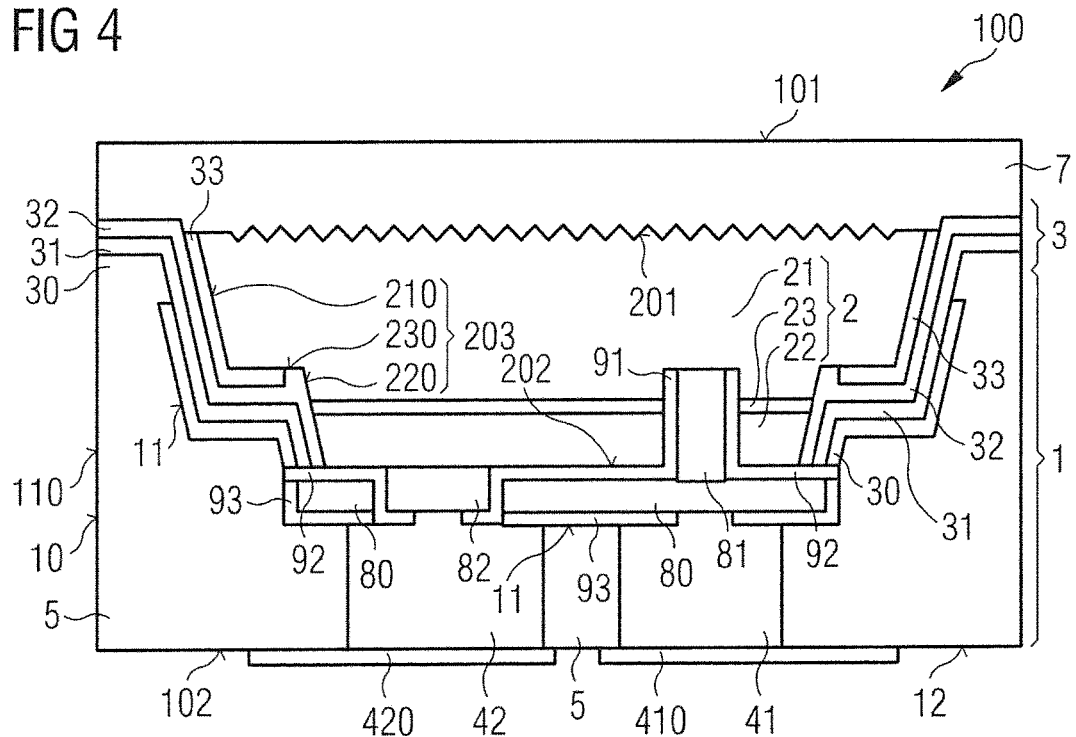

The example illustrated in FIG. 4 substantially corresponds to the example described in FIG. 3. Differing from FIG. 3, in which the metallic layer 30 extends to the side face 110 of the component 100, the side face 110 of the component 100 in FIG. 4 is free from a surface of the metallic layer 30. In particular, a lateral distance between the side face 110 of the component 100 and the metallic layer 30 can be at least 3 µm, for instance at least 5 µm or at least 10 µm. In such an embodiment of the metallic layer 30, this is not severed during singulation of the component 100, for instance, thereby simplifying the singulation process. Deviating from FIG. 4, it is possible that because of the step 210, 220 and 230, the metallic layer 30 is formed such that it imitates a contour of the step, wherein, unlike the illustration in FIG. 4, the metallic layer 30 can extend in the vertical direction as far as a subregion of the boundary layer 32 or of the dielectric layer stack 31 facing towards the converter layer 7 and runs horizontally. Deviating from FIG. 4, it is also possible that the side face 110 of the component is free from the multilayer structure 3. In this case, the mold body 5 can extend as far as the converter layer 7.

Apart from FIGS. 1 to 4, it is also possible that the boundary layer 32 of the multilayer structure 3 can be combined with the insulation structure 9. For example, the boundary layer 32 and the insulation layer 92 of the insulation structure 9 can be formed coherently or in one piece. This means that the boundary layer 32 and for instance the insulation layer 92 can be produced in a common method stage. It is also possible that the boundary layer 32 and the insulation layer 92 are produced by different method stages, the boundary layer 32 and the insulation layer 92 adjoining one another at least in places. The boundary layer 32 and the insulation layer 92 can be formed from the same material. The metallic layer 30 can also be combined for instance with the mirror layer 80. For example, the metallic layer 30 and the mirror layer 80 can be deposited on the semiconductor body 2 in a common method stage, for instance by an electroplating method. The metallic layer 30 and the mirror layer 80 here can be formed from the same material. In particular, the metallic layer 30 and the mirror layer 80 can be formed coherently or in one piece.

It is also possible for the mirror layer 80 to have a sufficiently large layer thickness so that the mirror layer 80 acts for instance as a reinforcing layer, which provides the component 100 with additional mechanical stability. In a top view, the mirror layer 80 covers a region arranged between the through-contacts 41 and 42 in the lateral direction. If the mirror layer 80 is formed as a reinforcing layer, this region can be mechanically stabilized between the through-contacts 41 and 42. Furthermore, it is also possible that the component 100 comprises a further stabilizing layer for instance with a minimum layer thickness of about 5 µm, formed for instance between the carrier 1 and the semiconductor body 2 or the mirror layer 80. In a top view, the stabilizing layer can bridge the region located between the through-contacts 41 and 42. It is also possible that the metallic layer 30 can be combined with the stabilizing layer at least in places.

In FIGS. 5A to 5E, various method stages of various examples of a method of producing a plurality of components are illustrated.

Figure 5A:
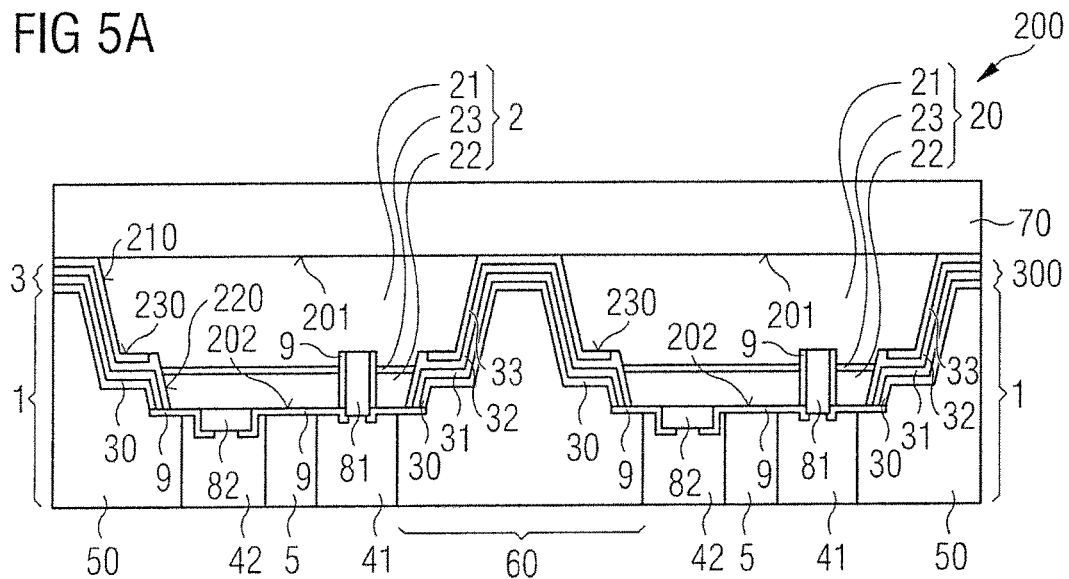
FIGS. 5A to 5E show schematic diagrams of various method stages of multiple examples of the production of a plurality of components.

FIG. 5A shows a composite 200 having a growth substrate 70 and a semiconductor composite 20 arranged on the growth substrate 70. The semiconductor composite 20 can be severed into a plurality of semiconductor bodies 2 by forming a plurality of separating trenches 60. The separating trenches 60 can each be formed as a two-step recess. The two-step recess has an internal wall containing a plane 230 in particular parallel to the first main surface 201 and/or the second main surface 202 of the semiconductor composite 20.

The plane 230 forms for instance an interface between a first subregion and a second subregion of the two-step recess. The first and second subregions of the two-step recess can be created in two separate method stages, for instance by etching. In particular, the first subregion has a larger cross-section than the second subregion. The first subregion can be formed such that it extends from the second main surface 202 through the second semiconductor layer 22 and the active layer 23 into the first semiconductor layer 21. In particular, the first subregion has a bottom surface formed exclusively by a surface of the first semiconductor layer 21. The second subregion of the two-step recess can be created on the bottom surface of the first subregion for instance by etching, part of the bottom surface of the first subregion forming the plane 230 of the two-step recess after creation of the second subregion. The second subregion of the two-step recess can extend in the vertical direction from the plane 230 to the growth substrate 70 or to shortly before this. The possibly remaining first semiconductor layer 21 can be cut through completely for instance during removal of the growth substrate 70 or during roughening of the first main surface 201. The growth substrate 70 here can be partly or completely removed from the semiconductor body 2 by a chemical, mechanical or thermal method or by a laser lift-off method.

A multilayer composite 300 can be formed at least in the regions of the separating trenches 60. In particular, the multilayer composite 300 can completely cover internal walls and/or bottom surfaces of the separating trenches 60. If the separating trenches 60 are each formed as a two-step recess with the plane 230, the multilayer composite 300 can be more easily deposited on the internal walls of the separating trenches 60.

A plurality of through-contacts 41 and 42 and a plurality of wiring structures 8 with a plurality of connection layers 82 and through-vias 81 are formed. An electrically insulating mold body composite 50 is formed on the semiconductor bodies 2 and in the regions of the separating trenches 60. In particular, the separating trenches 60 are completely filled by the mold body composite 50. The regions located between the through-contacts 41 and 42 can also be completely filled by the mold body composite 50.

Figure 5B:
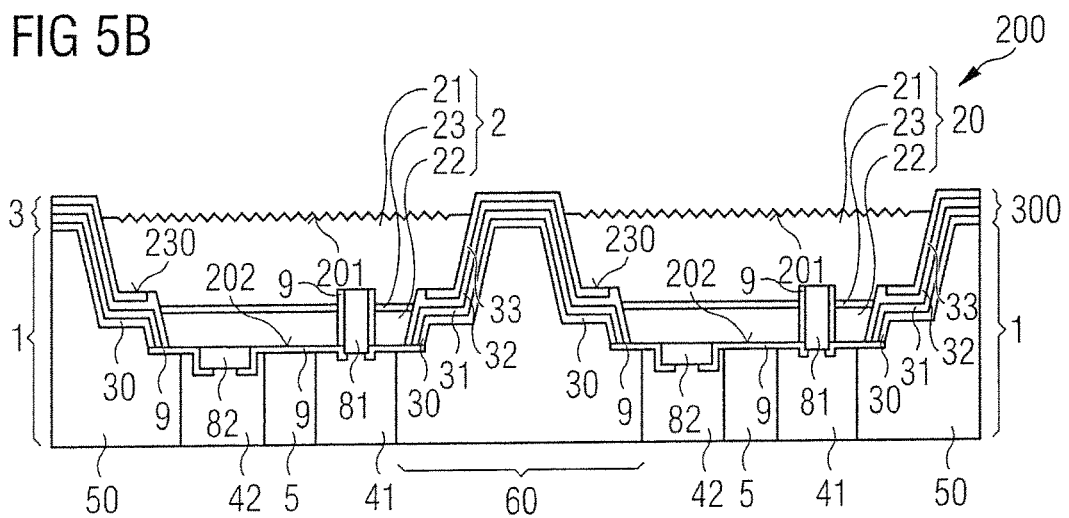

In FIG. 5B, the growth substrate 70 is removed. The first main surface 201 exposed after the removal of the growth substrate 70 can be patterned. The semiconductor body 2 can be roughened such that the multilayer composite 300 and/or the mold body composite 50 projects beyond it in the vertical direction.

In particular, an intermediate space 33 or a plurality of intermediate spaces 33 is/are created after the removal of the growth substrate 70, for instance during roughening of the semiconductor body 2. The intermediate space 33 or the plurality of intermediate spaces 33 in FIG. 5B can be formed by removal of a sacrificial layer, for example, a resist layer, an SiO2 layer or a ZnO layer, for instance in the region of the separating trench 60 or in the regions of the separating trenches 60. Before removal, the sacrificial layer can extend in the vertical direction for instance from the growth substrate 70 to the plane 230. At the plane 230 or on the plane 230, the sacrificial layer can for instance adjoin the boundary layer 32 of the multilayer composite 300. In this way, it can be ensured that the active layer 23 is completely covered for instance by the boundary layer 32 in the lateral direction.

Figure 5C:
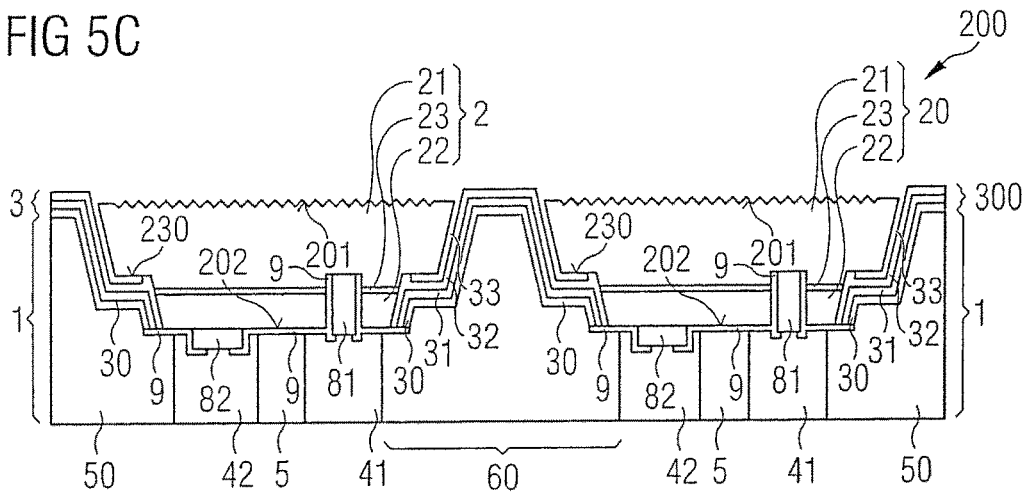
Figure 5D:
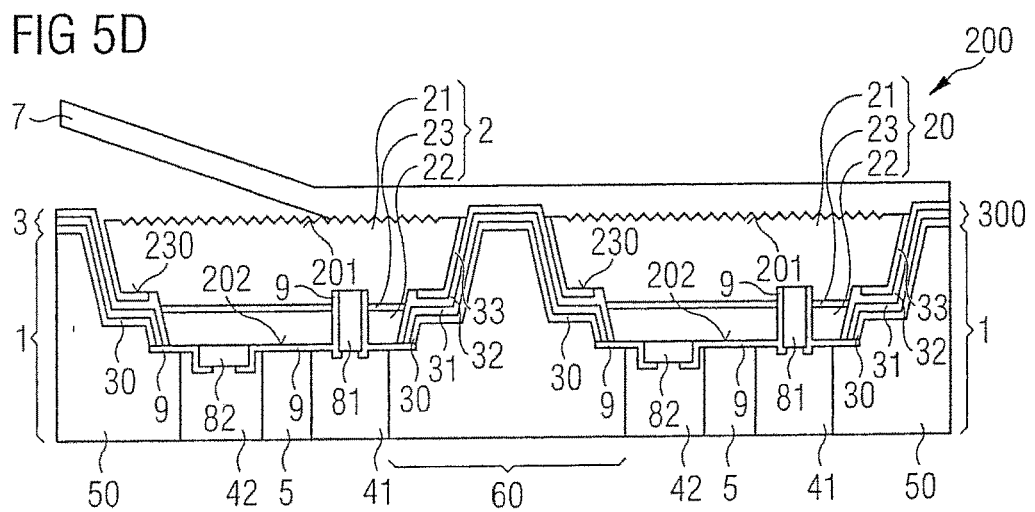

The sacrificial layer can, as illustrated in FIG. 5C, be partly or completely removed for instance by under-etching. As a result, the intermediate space 33 is formed as an air gap. In other words, after the removal of the sacrificial layer an intermediate space is obtained between the semiconductor body 2 and for instance the boundary layer 32, wherein the intermediate space 33 can be filled with air. After removal of the sacrificial layer, a converter layer 7, for instance in the form of a converter layer film, can be deposited on the semiconductor body 2 (FIG. 5D). The intermediate space 33 is sealed in an airtight manner in particular by formation of the converter layer 7 on the semiconductor body 2. The use of a converter film is particularly advantageous because this can prevent the intermediate space 33 from being filled during deposition of the converter layer 7 for instance with a liquid medium or with a material with a refractive index greater than 1 or greater than 1.3 or 1.4.

The composite 200 is then singulated along the separating trenches 60 into a plurality of components 100. The components 100 from the composite 200 illustrated in FIG. 5D obtained after singulation correspond substantially to the component 100 illustrated in FIG. 3. In contrast thereto, the mirror layer 80 and the intermediate insulation layer 93 are not illustrated in FIG. 5D. Deviating from FIGS. 5C and 5D, it is also possible that the sacrificial layer is removed only after the deposition of the converter layer 7, for instance after the singulation of the components 100, when the sacrificial layer becomes accessible, e.g., from the side face 110 of the component 100.

Figure 5E:
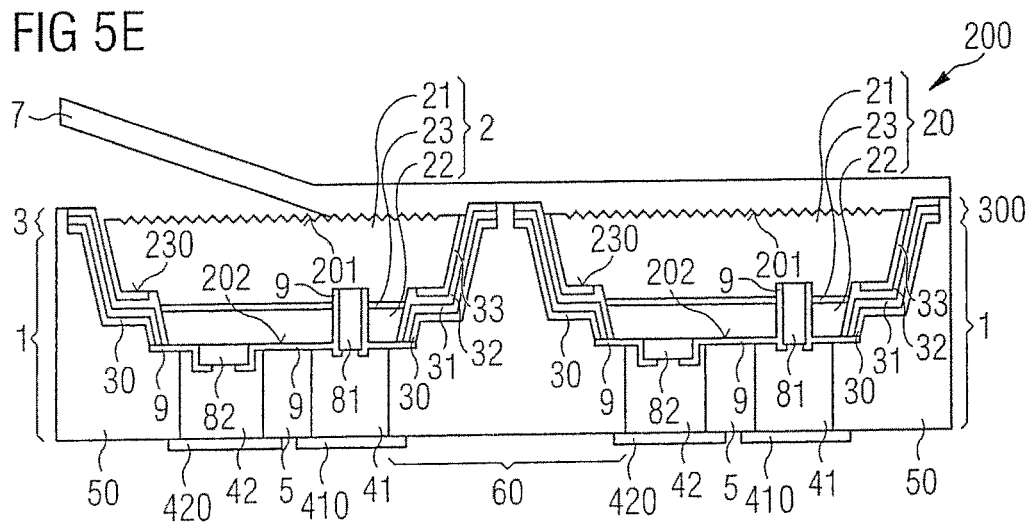

The example illustrated in FIG. 5E substantially corresponds to the example illustrated in FIG. 5D. In contrast thereto, the multilayer composite 300 is formed in a patterned manner in regions of the separating trenches 60. In particular, the bottom surface of the separating trenches 60 is free from the multilayer composite 300 in places. This facilitates the singulation of the composite 200 since the composite 200 only has to be cut through the mold body composite 50 and optionally through the converter layer 7 in regions of the separating trenches 60. Deviating from FIG. 5E, it is also possible that, in the regions of the separating trenches 60, only the metallic layer 30 is formed in a patterned manner, as illustrated for instance in FIG. 4, and the further layers of the multilayer composite 300, for instance the boundary layer 32 or the dielectric layer stack 31, are formed coherently and in an unpatterned manner. The bottom surface of the separating trench 60 can in this case be free from a thicker electroplated layer but can comprise a thin seed layer with a layer thickness of less than 1 µm. A component produced according to FIG. 5E can comprise a mold body 5 projecting beyond the entire semiconductor body 2 in the vertical direction and in particular adjoins the converter layer 7.

With the aid of a multilayer structure on a side face of a semiconductor body, wherein the multilayer structure comprises an electrically insulating, radiation-transmitting and low-refractive-index boundary layer and a preferably radiation-reflecting metallic layer, on the one hand total internal reflection can be favored at the side face of the semiconductor body and on the other hand reflection of the radiation passing through the boundary layer can be increased, as a result of which a lateral escape of the electromagnetic radiation generated during operation of the component is also prevented.

This application claims priority of DE 10 2015 112 538.2, the subject matter of which is incorporated herein by reference.

This description with the aid of the examples does not limit the disclosure thereto. Rather, our components and methods comprise any new feature and any combination of features, which in particular includes any combination of features in the appended claims, even if the feature or combination is not itself explicitly stated in the claims or examples.

The invention claimed is:

1. An optoelectronic component comprising a carrier having an electrically insulating mold body, a semiconductor body having an active layer configured to generate electromagnetic radiation during operation of the optoelectronic component and a multilayer structure, wherein
the electrically insulating mold body surrounds the semiconductor body laterally at least in places,
the multilayer structure is arranged between the semiconductor body and the electrically insulating mold body in a lateral direction at least in places, and
the multilayer structure comprises at least one metallic layer and a non-metallic boundary layer, wherein
the non-metallic boundary layer is arranged between the semiconductor body and the metallic layer in the lateral direction, adjoins the semiconductor body at least in places, covers the active layer laterally, and has a lower refractive index compared to the semiconductor body,
the metallic layer is configured to prevent the electromagnetic radiation generated during operation of the optoelectronic component and passes through the non-metallic boundary layer from impinging on the electrically insulating mold body,
the non-metallic boundary layer is forming from a radiation-transmitting dielectric material having a refractive index of 1 to 2, and
a layer thickness of the non-metallic boundary layer is at least 400 nm and selected such that an amplitude of an evanescent wave, which is obtained in the event of total internal reflection at an interface between the non-metallic boundary layer and the semiconductor body, is reduced to less than 37% of its original value within the non-metallic boundary layer.

2. The optoelectronic component according to claim 1, in which an adhesive layer is arranged between the non-metallic boundary layer and the semiconductor body, the adhesive layer having a layer thickness of no more than 50 nm.

3. The optoelectronic component according to claim 1, further comprising an intermediate space between the semiconductor body and the non-metallic boundary layer in the lateral direction, wherein the intermediate space is a space which is empty of gas or is filled with a gaseous medium.

4. The optoelectronic component according to claim 3, wherein both the non-metallic boundary layer and the intermediate space adjoin the semiconductor body in places, and the intermediate space and the active layer are free from overlaps along the vertical direction.

5. The optoelectronic component according to claim 1, wherein the metallic layer has a layer thickness of at least 100 nm and contains or consists of a metal so that the metallic layer has an absorbing or reflecting effect for the electromagnetic radiation generated by the active layer during operation of the optoelectronic component.

6. The optoelectronic component according to claim 1, wherein the multilayer structure comprises a radiation-reflecting layer stack composed of a plurality of dielectric layers with different refractive indices, and the radiation-reflecting layer stack is arranged between the metallic layer and the non-metallic boundary layer in the lateral direction.

7. The optoelectronic component according to claim 1, wherein the semiconductor body has a first main surface facing away from the carrier, a second main surface facing towards the carrier and a side face, the side face joins the first main surface to the second main surface along the vertical direction, and at least 90% of the side face or the entire side face is covered in the lateral direction by the multilayer structure.

8. The optoelectronic component according to claim 1,
wherein the semiconductor body has a first main surface facing away from the carrier, a second main surface facing towards the carrier and a side face,
the side face joins the first main surface to the second main surface along a vertical direction,
the side face comprises a step with a plane extending in lateral directions,
the plane of the step is formed exclusively by a surface of a first semiconductor layer of the semiconductor body, and
the first semiconductor layer is arranged between the first main surface and the active layer.

9. The optoelectronic component according to claim 1, wherein the carrier that electrically contacts the semiconductor body comprises at least one through-contact extending through the electrically insulating mold body in the vertical direction and is surrounded to the full extent by the electrically insulating mold body in lateral directions.

10. The optoelectronic component according to claim 1, further comprising a mirror layer on a main surface of the semiconductor body facing towards the carrier, wherein the mirror layer, projects sidewards in the lateral direction beyond the main surface and/or the active layer.

11. The optoelectronic component according to claim 1, further comprising a stabilizing layer having a layer thickness greater than or equal to 5 micrometers, wherein the stabilizing layer is arranged between the carrier and the semiconductor body.

12. A method of producing components comprising:
A) preparing a composite having a growth substrate and a semiconductor composite arranged on the growth substrate;
B) forming separating trenches to sever the semiconductor composite into semiconductor bodies;
C) forming a multilayer composite at least in regions of the separating trenches;
D) forming an electrically insulating mold body composite on the semiconductor bodies and in the regions of the separating trenches;
E) removing the growth substrate; and
F) singulating the composite along the separating trenches into the components so that the components each comprise a carrier with an electrically insulating mold body as part of the electrically insulating mold body composite, a semiconductor body with an active layer configured to generate electromagnetic radiation during operation of one associated component and a multilayer structure as part of the multilayer composite, wherein the electrically insulating mold body laterally surrounds the semiconductor body at least in places,
the multilayer structure is arranged between the semiconductor body and the electrically insulating mold body in the lateral direction at least in places,
the multilayer structure comprises a metallic layer and a non-metallic boundary layer, wherein
the non-metallic boundary layer is arranged between the semiconductor body and the metallic layer in the lateral direction, adjoins the semiconductor body at least in places, and covers the active layer laterally and has a lower refractive index compared to the semiconductor body,
the metallic layer is configured to prevent the electromagnetic radiation generated during operation of the component and passes through the non-metallic boundary layer from impinging on the electrically insulating mold body, and
the semiconductor body is roughened such that the multilayer structure projects beyond the semiconductor body in the vertical direction.

13. The method according to claim 12, wherein the formation of the separating trenches in the semiconductor composite takes place by a first stage and a second subsequent stage so that the separating trenches each comprise an internal wall with a step, and the step contains a plane extending in lateral directions, which is formed by the first stage and before the second stage.

14. The method according to claim 12, wherein a sacrificial layer is deposited on a side face of the semiconductor body at least in the region of one of the separating trenches, and the sacrificial layer is at least partly removed to form an intermediate space between the semiconductor body and the metallic layer after the removal of the growth substrate.

15. The method according to claim 14, wherein a converter layer is deposited on the semiconductor body after formation of the intermediate space so that the intermediate space is sealed by the formation of the converter layer.

16. The method according to claim 12, wherein
the non-metallic boundary layer is formed from a radiation-transmitting dielectric material having a refractive index of 1 to 2,
a layer thickness of the non-metallic boundary layer is at least 400 nm and selected such that an amplitude of an evanescent wave, which is obtained in the event of total internal reflection at an interface between the non-metallic boundary layer and the semiconductor body, is reduced to less than 37% of its original value within the non-metallic boundary layer, and
an adhesive layer is arranged between the non-metallic boundary layer and the semiconductor body, the adhesive layer having a layer thickness of no more than 50 nm.

17. The optoelectronic component according to claim 1, wherein the semiconductor body is roughened such that the multilayer composite projects beyond the semiconductor body in the vertical direction.

18. The method according to claim 12, wherein
the multilayer composite or the metallic layer is formed in a patterned manner in regions of the separating trenches, and a bottom surface of the separating trenches is free from the multilayer composite or free of the metallic layer in places, and
the composite is singulated along the separating trenches into the components.

19. The optoelectronic component according to claim 1, wherein the electrically insulating mold body completely surrounds the semiconductor body laterally and the electrically insulating mold body projects beyond the entire semiconductor body in the vertical direction.

20. An optoelectronic component comprising a carrier having an electrically insulating mold body, a semiconductor body having an active layer configured to generate electromagnetic radiation during operation of the optoelectronic component and a multilayer structure, wherein
- the electrically insulating mold body surrounds the semiconductor body laterally at least in places,
- the multilayer structure is arranged between the semiconductor body and the electrically insulating mold body in a lateral direction at least in places, and
- the multilayer structure comprises at least one metallic layer and a non-metallic boundary layer, wherein
- the non-metallic boundary layer is arranged between the semiconductor body and the metallic layer in the lateral direction, adjoins the semiconductor body at least in places, and covers the active layer laterally and has a lower refractive index compared to the semiconductor body,
- the metallic layer is configured to prevent the electromagnetic radiation generated during operation of the optoelectronic component and passes through the non-metallic boundary layer from impinging on the electrically insulating mold body, and
- the semiconductor body is roughened such that the multilayer structure projects beyond the semiconductor body in the vertical direction.

* * * * *